United States Patent [19]

Hoshi et al.

[11] Patent Number: 5,299,091
[45] Date of Patent: Mar. 29, 1994

[54] PACKAGED SEMICONDUCTOR DEVICE HAVING HEAT DISSIPATION/ELECTRICAL CONNECTION BUMPS AND METHOD OF MANUFACTURING SAME

[75] Inventors: Akio Hoshi, Isesaki; Yukihiro Sato, Maebashi; Toyomasa Koda, Takasaki; Isao Yoshida, Tokyo; Kouzou Sakamoto, Hachioji, all of Japan

[73] Assignees: Hitachi, Ltd., Tokyo; Hitachi Tohbu Semiconductor, Ltd., Saitama, both of Japan

[21] Appl. No.: 854,028

[22] Filed: Mar. 19, 1992

[30] Foreign Application Priority Data

Mar. 20, 1991 [JP] Japan ................... 3-082003

[51] Int. Cl.5 ............................. H05K 7/20
[52] U.S. Cl. .................... 361/723; 29/827; 257/675; 174/16.3; 174/524; 228/180.22
[58] Field of Search ............ 29/827; 174/16.3, 52.4; 228/180.2; 357/74, 80–81, 69–70; 361/383, 386–389, 403, 421; 439/70, 71

[56] References Cited

U.S. PATENT DOCUMENTS 4,764,804  8/1988  Sahara et al. ............. 361/387
4,945,451  7/1990  Gohl et al. ............... 361/386

FOREIGN PATENT DOCUMENTS 60-137041  7/1985  Japan .
60-137042  7/1985  Japan .
63-296345 12/1988  Japan .
0307768  12/1988  Japan ...................... 361/386
2-37756   2/1990  Japan .
2-68243   2/1990  Japan .
2-63143   3/1990  Japan .
2-114658  4/1990  Japan .

*Primary Examiner*—Gregory D. Thompson
*Attorney, Agent, or Firm*—Pennie & Edmonds

[57] ABSTRACT

A packaged semiconductor device has, according to one embodiment of the present invention, a semiconductor pellet having an electronic circuit therein and electrode pads formed on a principal surface of the pellet, a plurality of electrical connection bumps provided on the electrode pads, a plurality of heat dissipation bumps provided at the principal surface of the pellet and electrically insulated from the electronic circuit and the electrode pads, electrical connection leads for the electronic circuit, heat dissipators for the electronic circuit and a packaging material for sealing pellet, the electrical connection bumps, the heat dissipation bumps and parts of the electrical connection leads and the heat dissipator. One or more of the heat dissipation bumps are arranged relatively nearer to the electronic circuit than the electrical connection bumps for thermal coupling to the electronic circuit. One or more of the electrical connection leads may be engaged with the electrical connection bumps and the heat dissipation bumps and/or one or more of the dissipators may be engaged with the heat dissipation bumps and the electrical connection bumps, thereby serving to effect electrical connection to and heat dissipation for the electronic circuit.

11 Claims, 17 Drawing Sheets

FIG. I

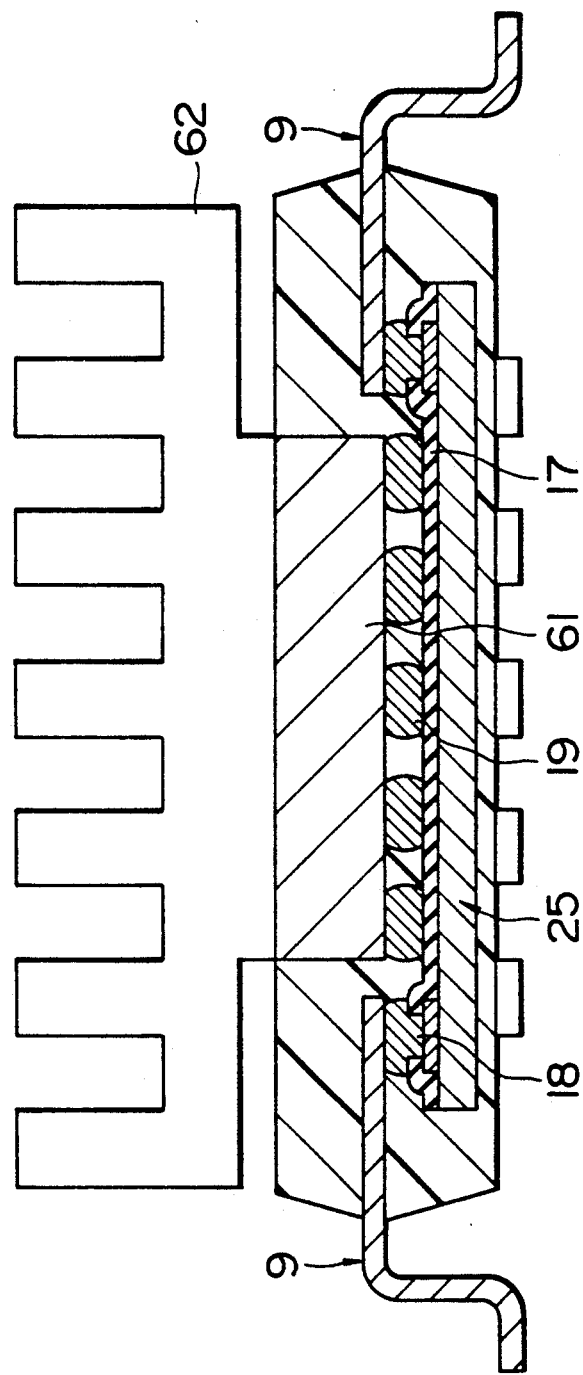

PACKAGED SEMICONDUCTOR DEVICE HAVING HEAT DISSIPATION/ELECTRICAL CONNECTION BUMPS AND METHOD OF MANUFACTURING SAME

BACKGROUND OF THE INVENTION

This invention relates to a packaged semiconductor device and a method of manufacturing packaged semiconductor devices, and more particularly to a technology for improving the heat dissipation capability of, for example, a semiconductor integrated circuit device (hereinafter referred to as an IC device) which is capable of handling high voltages and large currents and which is required to have a high heat dissipation capability.

With the increasing number of functions, higher component density, and increasing speed of IC devices in recent years, there has been a requirement for development of so-called power IC devices capable of handling high voltages and large currents In such power IC devices, the improvement of the heat dissipation (radiation) property is an important technical target eagerly pursued.

Examples of IC devices with fine heat dissipation property are disclosed in the following references.

A first one is JP-A No. 63-296345 (laid-open on Dec. 2, 1988). This laid-open patent application discloses a film carrier which comprises an insulating film, a plurality of electrodes formed on the insulating film, and a conductor pattern which also serves for heat dissipation. In this published patent application, a film carrier has the above-mentioned electrodes and semiconductor devices bonded together at substantially the center areas of the film. The above-mentioned conductor pattern formed by a part of the conductor pattern comprises a heat dissipator provided at the center of the insulating film, a little separated from the surface of the semiconductor device, in such a manner as to cover the device surface, and heat dissipation pieces connected with this heat dissipator extend up to the peripheral edges of the insulating film. The above-mentioned device surface and the above-mentioned heat dissipation pattern are fixed together in resin molding.

A second one is JP-A No. 2-63143 (laid-open on Mar. 2, 1990). This laid-open pattern application concerns a resin-molded package of a. semiconductor device made by Tape Automated Bonding (TAB), and this semiconductor device package has the metal or ceramic pieces bonded to the rear side thereof and extending beyond the device surface Since the TAB method is used for this semiconductor device, the metal pieces about 0.035 mm to 0.07 mm.

What is collectively referred to as a third case are JP-A No. 2-114658 (laid-open on Apr. 26, 1990), JP-A No. 60-137041 (laid-open on Jul. 20, 1985), JP-A No. 60-37042 (laid-open on Jul. 20, 1985), JP-A No. 2-37756 (laidopen on Feb. 7, 1990), and JP-A No. 2-58243 (laid-open on Feb. 27, 1990).

In any of these laid-open patent applications, a semiconductor device having the following features is disclosed. That is to say, in this semiconductor device, the semiconductor pellet (hereafter referred to as a pellet) has an integrated circuit configured in the first principal surface and also has a plate-like heat dissipator mounted by using a resin.

In the prior art, however, not only there is a limit to the development of the heat dissipation performance, but also there are many other hurdles, which include the need to prevent the device from being contaminated by adhesives used, the need to take measures against the cost increase due to the use of polyimide film, and the limited compatibility of the assembly equipment between bonding of leads to a semiconductor pellet and bonding of heat dissipation means to the semiconductor pellet. Consequently, problems arise as follows.

(1) It is difficult to secure the quality and the reliability of low thermal resistance IC devices.
(2) It is difficult to reduce the cost.
(3) It is difficult to carry out an integrated manufacture.

SUMMARY OF THE INVENTION

This invention has as its object to provide a packaged semiconductor device improved in heat dissipation performance, and a method of manufacturing this packaged semiconductor device According to one aspect of the present invention, a packaged semiconductor device has:

a semiconductor pellet having an electronic circuit therein and electrode pads formed on a principal surface of the pellet, the electronic circuit having a tendency to generate heat in operation;

one or more first bumps provided on one or more of the electrode pads and electrically connected thereto;

one or more second bumps provided at the principal surface of the pellet and electrically insulated from the electronic circuit and the electrode pads, at least one second bump being arranged relatively nearer to the electronic circuit than the first bump for thermal coupling to the electronic circuit;

first lead means provided so as to be at least engaged with said one or more first bumps for electrical connection to the electrode pads;

second lead means provided so as to be at least engaged with said one or more second bumps for thermal coupling to the electronic circuit to conduct heat generated by the electronic circuit externally for heat dissipation; and a packaging material sealing the pellet, first and second bumps and parts of the first and second lead means.

According to another aspect of the present invention, a packaged semiconductor device comprises a semiconductor pellet having an integrated circuit formed in a principal surface thereof and a plurality of electrode pads formed on the principal surface thereof;

a plurality of leads being electrically connected to and thermally engaged with the electrode pads of the semiconductor pellet through electrical connection bumps, said leads leading the integrated circuit electrically to the outside;

at least one heat dissipator at least in thermal contact with the principal surface of the semiconductor pellet through heat dissipation bumps and conducting the generated heat of the semiconductor pellet to the outside; and a resin-molded package for sealing with resin the semiconductor pellet, part of the leads and part of the heat dissipators.

Heat dissipators are thermally engaged, through the heat dissipation bumps, with the principal surface of the semiconductor pellet in which the integrated circuit has been configured, so that heat connected to and thermally engaged with the electrode generated by the semiconductor pellet can be conveyed by conduction to the heat dissipators through the heat dissipation bumps. Therefore, the heat dissipation performance can be increased substantially.

BRIEF DESCRIPTION OF THE DRAWINGS

FIG. 15 is a sectional view of a packaged semiconductor device according to an embodiment of the present invention.

DESCRIPTION OF THE PREFERRED EMBODIMENTS

Figure 1:
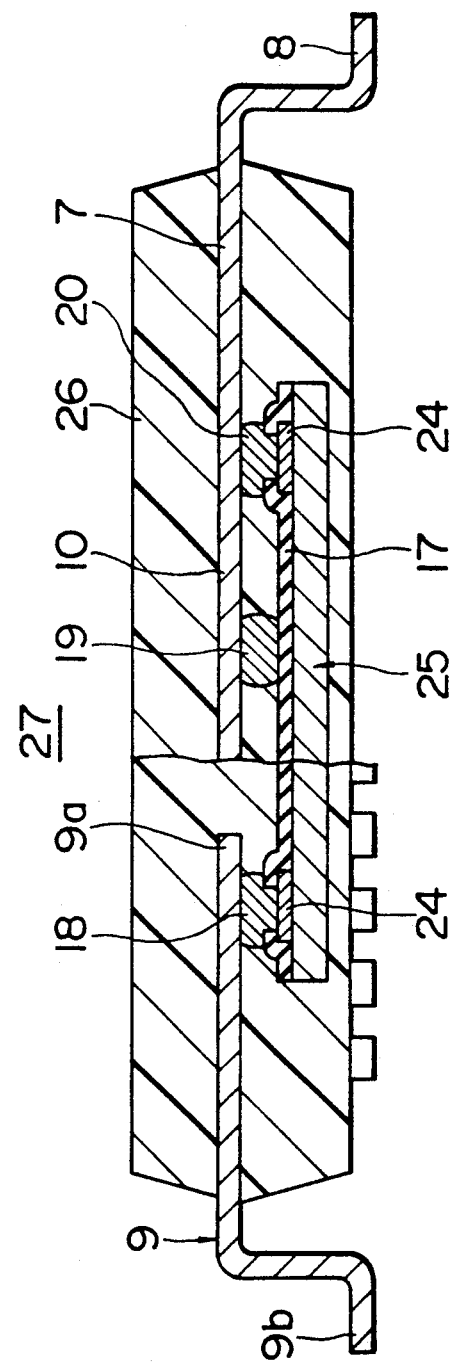
FIG. 1 is a sectional view, taken along line I—I of FIG. 2, of a packaged semiconductor device according to an embodiment of the present invention
Figure 2:
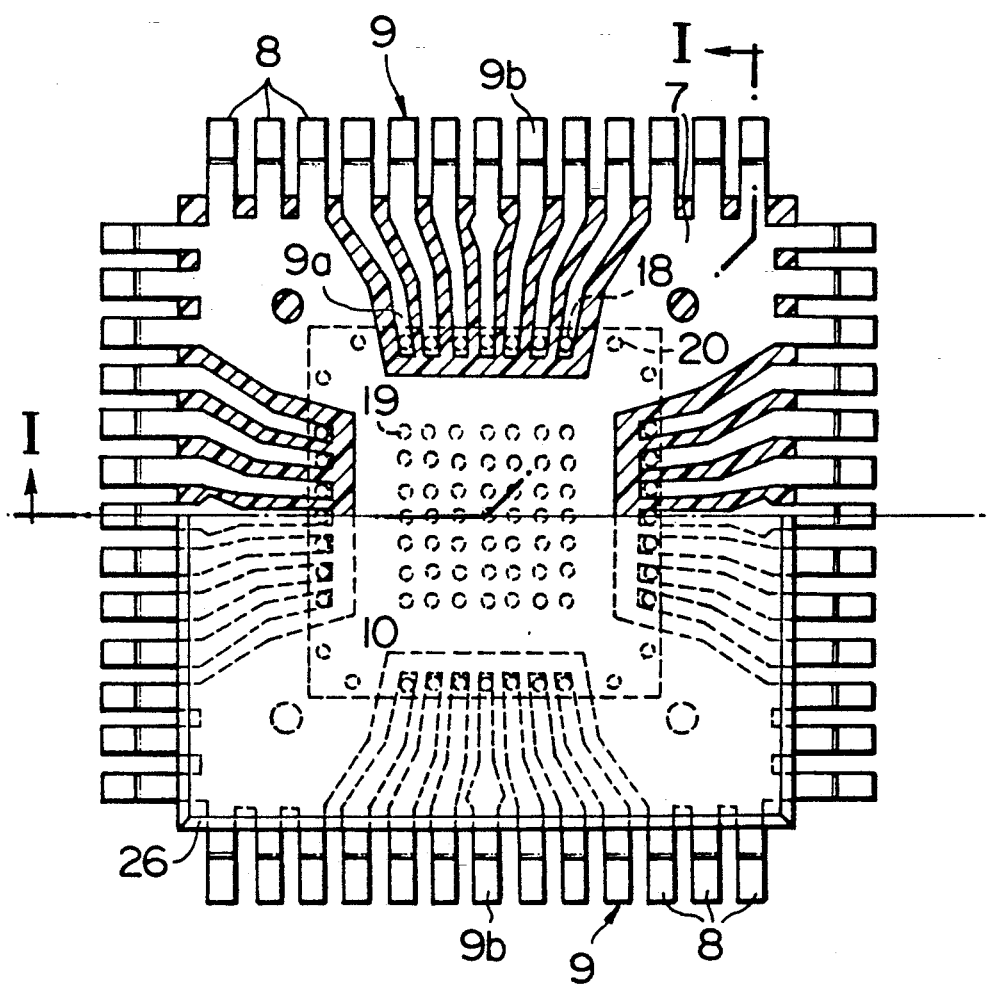
FIG. 2 is a plan view, partially cut away, of the device in FIG. 1.

FIG. 1 is a sectional view taken along the line I—I of FIG. 2 showing an IC device (packaged semiconductor device) having a quad flat package according to a first embodiment of the present invention. FIG. 2 is a plan view, partially in cross section, of the above-mentioned IC device. FIGS. 3 to 12 are diagrams for explaining the manufacturing method of the IC device according to the first embodiment of the present invention.

In this embodiment, the semiconductor device is structured as an IC device having an efficient heat dissipation resin-molded quad flat package (hereafter sometimes referred to as a low thermal resistance QFP•IC device) of a decreased thermal resistance As shown in FIGS. 1 and 2, this low thermal resistance QFP•IC device 27 comprises a silicon semiconductor pellet 25 having an electronic circuit formed therein, a plurality of leads 9 disposed along the four sides of the pellet, each lead comprising an inner portion 9a and an outer portion 9b, electrical connection bumps 18 provided on electrode pads 24 formed on a principal surface of the pellet and being in contact with the inner portions 9a of the leads for electrical connection therewith, a heat dissipation tab 10 for dissipating the generated heat of the pellet 25 to the outside, heat dissipation bumps 19 provided on the principal surface of the pellet so as to be insulated from the electronic circuit and the electrode pads 24 and thermally coupled to the electronic circuit, heat dissipation bumps 20 (hereafter referred to as bumps for electrical connection and heat dissipation) provided in contact with the heat dissipation tab 10, each arranged on one electrode pad 24 for electrical connection therewith, and a package 26 having all those components molded in resin. At least one of the heat dissipation bumps 19 is arranged closer to the electronic circuit for effective thermal coupling therewith than the electrical connection bumps 18 are. Heat dissipation (fin) leads 7 are formed integrally with the heat dissipation tab 10 and extend therefrom, and heat dissipation fins 8, which are formed integrally with the tab 10 and the leads 7, protrude to the outside of the resin-molded package 26. This low thermal resistance type QFP•IC device is made by the following manufacturing method.

Figure 3:
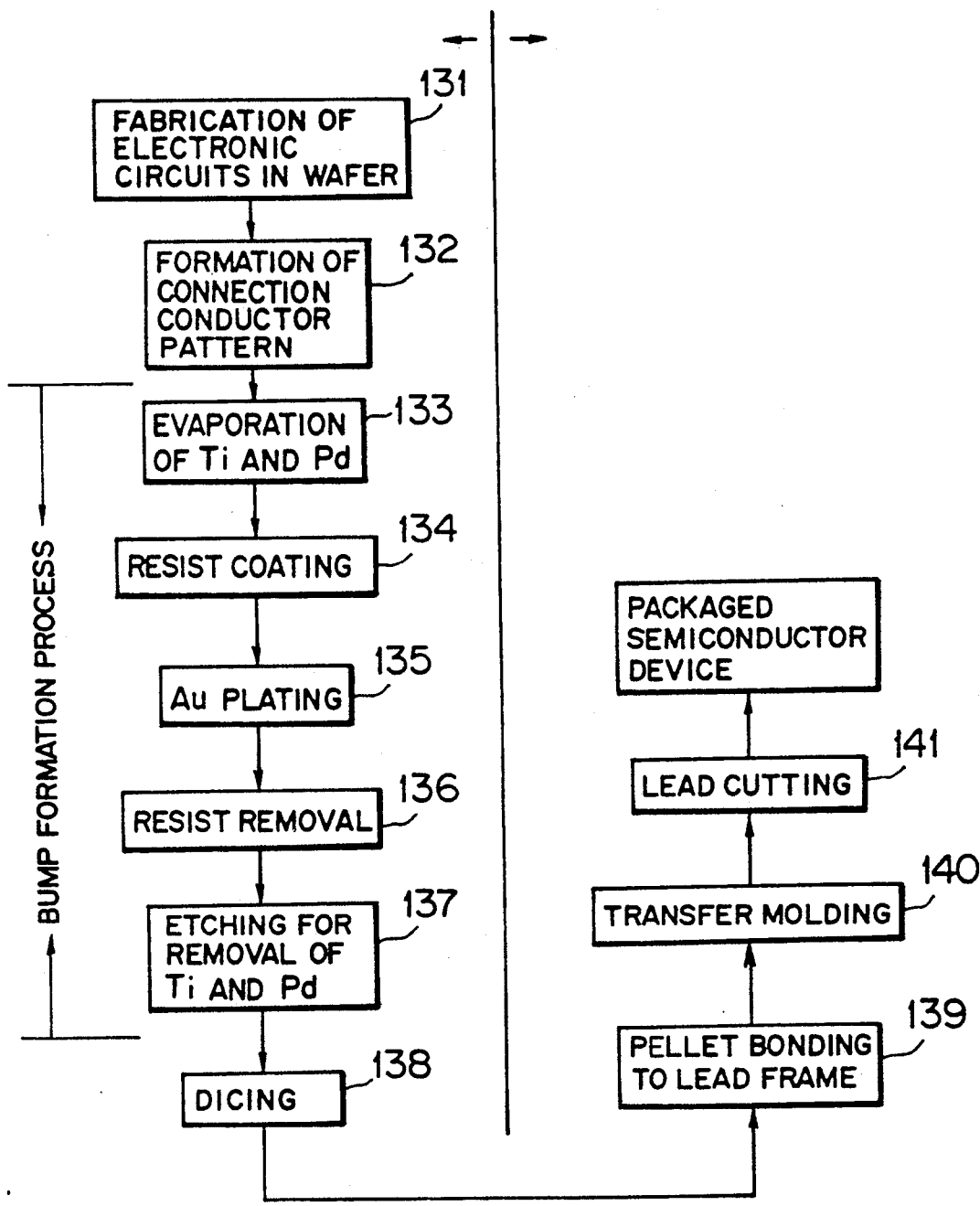
FIG. 3 is a process diagram showing a manufacturing method according to an embodiment of the present invention.

With reference to FIG. 3, description will be made of the manufacturing method of a low thermal resistance QFP•IC device according to the first embodiment of the present invention. This description will also clarify details of the composition of the low thermal resistance QFP•IC device.

Figure 4:
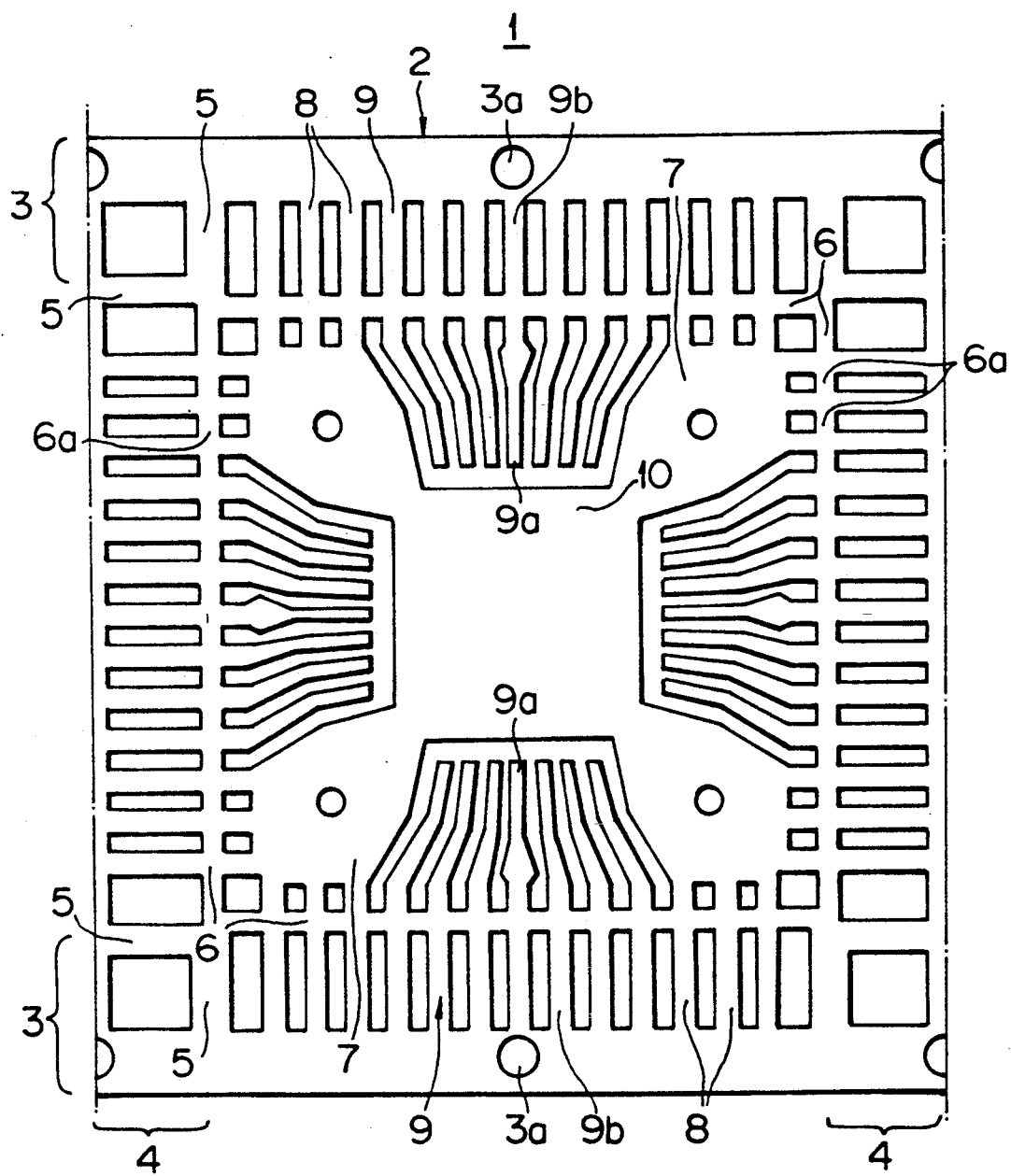
FIG. 4 is a plan view showing a part of a chain of leadframes.

As shown in FIG. 3, in this manufacturing method of the low thermal resistance QFP•IC device, a chain of leadframes is produced. A leadframe chain 1 is formed as shown in FIG. 4. This leadframe chain 1 is a thin metal sheet 0.1 mm to 0.28 mm thick made of a material with fine electrical and thermal conductivity, such as an Fe-Ni alloy, a copper alloy (e.g. phosphor bronze), or the like. The leadframe chain 1 is formed as a one body by using an adequate means such as a punching process or an etching process. Then, this leadframe chain 1 is plated with tin (Sn), gold (Au) or solder (Sn-Pb) for ensuring proper connection with bumps, which will be described later. The leadframe chain 1 has a plurality of leadframes 2 arranged in a continuous chain, but for the sake of simplicity, only a single leadframe is illustrated. A leadframe 2 is provided with a couple of outer frame members 3 in which positioning holes 3a are opened. The outer frame members 3 are separated a specified distance and arranged in parallel with each other. Adjoining leadframes have section frame members 4 provided therebetween, and leadframes 2 are arranged within substantially square frames comprising outer frame members 3 and section frame members 4.

In each leadframe 2, connection areas of the outer frame members 3 with the section frame members 4 form tie bar supporters 5, and by the tie bar supporters 5, four tie bars 6 are arranged to form a substantially square frame and the tie bars 6 are supported in an integral body. At corners of the square frame formed by the tie bars 6, four heat dissipation (fin) leads 7 are provided integrally so as to extend in the diagonal directions. At the distal end portions of the four heat dissipation (fin) leads 7, heat dissipation fins 8 are provided integrally to extend outwardly. The heat dissipation fins 8 are formed in a shape and at positions similar to the outer portions 9b of the leads 9, which will be described later. At proximal end portions of the heat dissipation (fin) leads 7, that is, at the center of the leadframe, a heat dissipation tab in a substantially square shape is provided. The heat dissipation tab 10 is provided integrally with the heat dissipation (fin) leads 7. The heat dissipation tab 10, supported by the heat dissipation (fin) leads 7, is positioned so as to be in a plane in which the leads are arranged.

The tie bars 6 are provided with a plurality of leads 9 which are equally spaced and extend radially. The leads 9 are provided integrally in parallel with one another, and extend perpendicularly to the tie bars 6. The proximal ends of the leads 9 form the inner portions 9a thereof and are arranged to face the peripheral portion of the pellet to be describe later. On the other hand, the proximal ends of the leads 9 form the outer portions 9b thereof and are continuous to the outer frame members 3 and the section frame members 6. Portions of the tie bar that lie between the adjoining leads 9 and 9 substantially form dams 6a for blocking the flow of resin in package molding, which will be described later.

Figure 5:
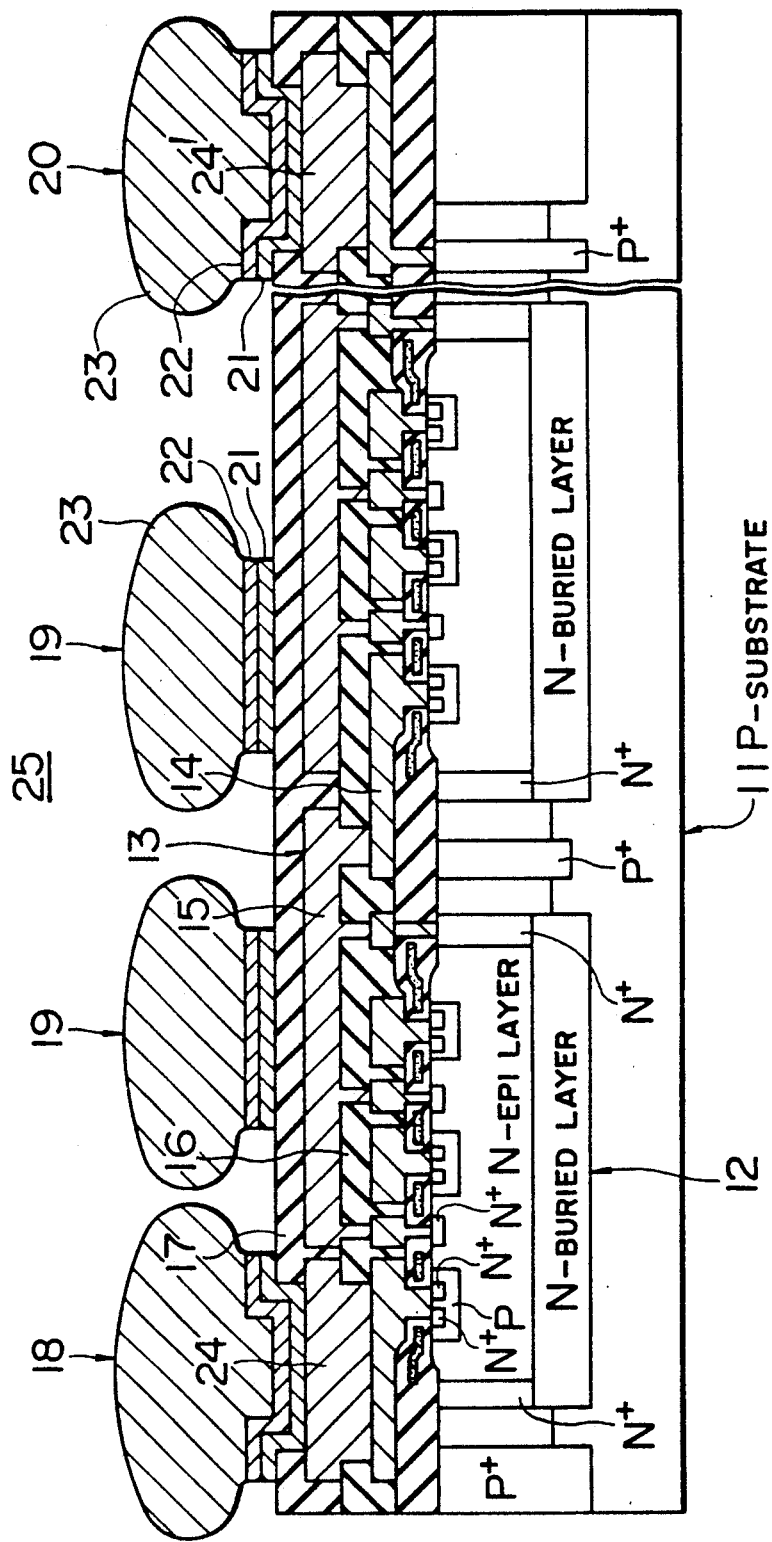
FIG. 5 is a sectional view of a part of the pellet on which bumps are provided according to an embodiment of the present invention.

On the other hand, in the manufacturing method of this low thermal resistance QFP•IC device, at the pellet manufacturing step, a pellet 25 as shown in FIG. 5 is formed, and an electrical connection bump 18, heat dissipation bumps 19 and an electrical connection and heat dissipation bump are formed on the pellet. The pellet and bump manufacturing operation is performed on a wafer in the so-called former process in the semiconductor device fabrication process, that is to say, in the state of the wafer before scribe cut. The pellet and the bumps shown in FIG. 5 are formed by the steps presented in FIG. 3. The bump formation process will be described in the following.

Figure 6:
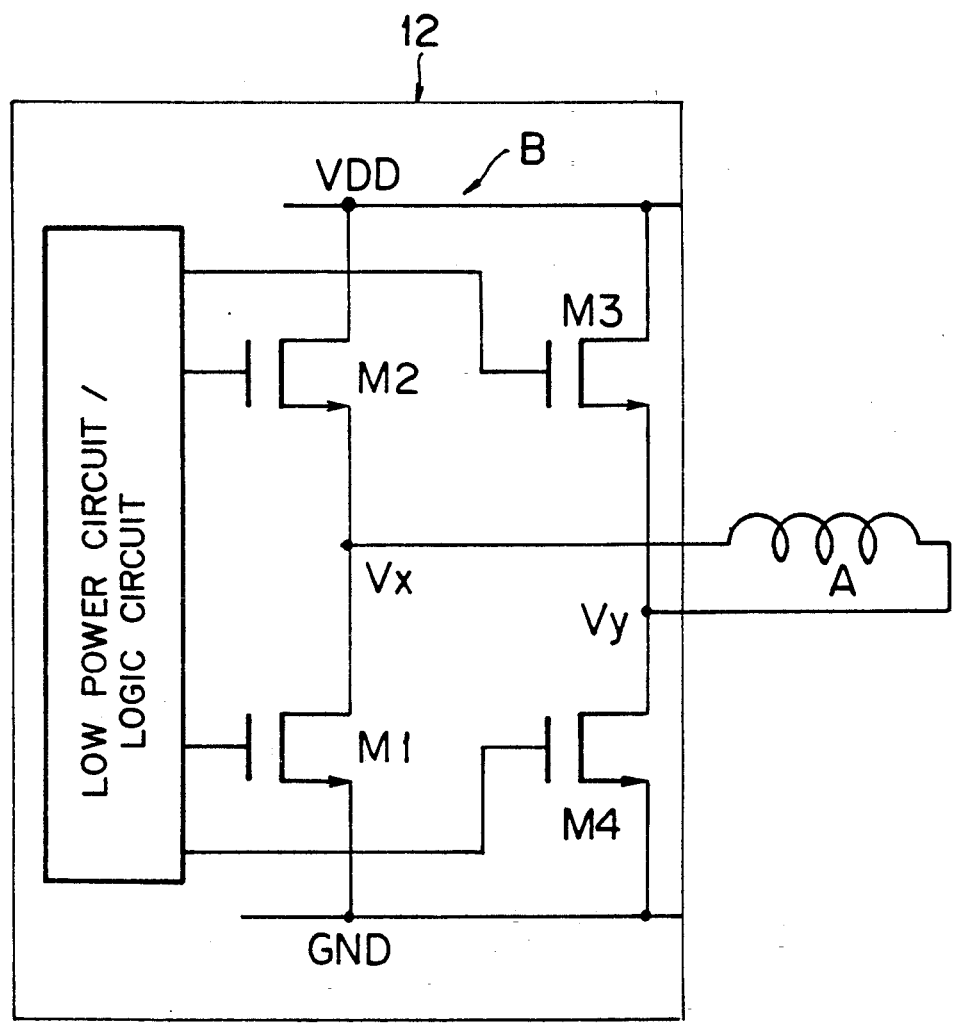
FIG. 6 is a circuit diagram showing an electronic circuit configured in the pellet.

In the so-called former process of the semiconductor device, a desired integrated circuit is fabricated in each pellet while the pellets are not separate in the wafer (step 131). In a pellet 25 shown in FIG. 5, for example, an integrated circuit or an electronic circuit 12 of MOS structure is fabricated in a P-substrate. The integrated circuit 12 may sometimes contain a bridge circuit shown in FIG. 6 or the like, for example. In FIG. 6, four transistors Ml, M2, M3 and M4 are connected to form a bridge circuit B. To the output terminal of this bridge circuit B, a load A for a relatively large output such as a high impedance is connected.

Then, an electrical wiring (conductor pattern) 13 is formed on the integrated circuit 12 in the conductor formation step (step 132). This wiring conductor pattern forming operation is executed b using aluminum in a suitable film deposition process such as sputtering, evaporation or the like and a lithography process. In the pellet 25 shown in FIG. 5, the wiring conductor pattern 13 includes a first level conductor pattern 14 and a second level conductor pattern 15, and the first level conductor pattern 14 and the second level conductor pattern 15 are insulated from each other by a layer insulation film 16. A passivation film 17 is deposited on the second level conductor pattern 15, and this passivation film 17 comprises a hard insulation film such as a silicon oxide film ($SiO_2$) or a silicon nitride film (SiN).

In the subsequent bump formation process, bumps are formed on the pellet 25. In this embodiment, the bumps include one or more electrical connection bumps 18 (hereinafter sometimes referred to as the first bumps), one or more heat dissipation bumps 19 (hereafter sometimes referred to as the second bumps), and one or more electrical connection and heat dissipation bumps 20 (hereafter sometimes referred to as the third bumps). The bumps 18, 19 and 20 each comprise a first base layer consisting of titanium (Ti) or the like, a second base layer 22 consisting of palladium (Pd), and a bump material 23 consisting of gold (Au), copper (Cu), solder (Sn-Pb) or the like. Ti is vapor-deposited on the pellets 25 in the wafer, and then, Pd is vapor-deposited on the deposited Ti film (step 133). After a resist pattern is applied to the deposited Pd film (step 134), Au is plated on the exposed Pd film (step 135). Then, the resist film is removed (step 136) and the deposited Ti film and the deposited Pd film are removed by etching (step 137). By those process steps, the bumps 18, 19 and 20 are formed, each comprising the first base layer 21, the second base layer 22 and the bump main body 23.

The first bump 18 is electrically connected to the electrode pad 24 formed on the first level conductor pattern 14, and is also electrically connected through the electrode pad 24 and the first level conductor pattern 14 to the integrated circuit or electronic circuit 12. In contrast, the second bump 19 is insulated from the electronic circuit 12 and the electrode pads 24 and 24' and fixed to the passivation film 17. The third bump 20 is electrically connected and thermally coupled to the electrode pad 24' formed on the first level conductor pattern 14. That portion of the first level conductor pattern 14 which is connected to the electrode pad 24' is also connected to a P-substrate 11. Therefore, the third bump 20 is electrically connected to the P-substrate 11 and accordingly at the reference potential.

One or more first bumps 18 are arranged at the peripheral portion of the pellet as shown in FIG. 2 so as to face the inner portions 9a of the corresponding leads 9 in the leadframe 2. One or more second bumps 19 are arranged substantially at the center of the principal surface of the pellet 25. The second bumps 19 are provided so as to correspond to and extensively cover an active area of the pellet 25 which is supposed to generate heat, and on the other hand, correspond to the center area of the heat dissipation tab 10 in the leadframe 2. In addition, one or more third bumps 20 are arranged at such suitable positions as not to interfere with the first and second bumps 18 and 19, and correspond to the corner areas of the heat dissipation tab 10 of the above-mentioned leadframe 2, for example. The third bumps are not indispensable but should preferably be provided to improve the heat dissipation performance.

The wafer on which the pellets 25 and the bumps 18, 19 and 20 have been formed as described are divided into individual pellets 25 in a dicing step (step 138). Separated pellets 25 are tiny flat plates in a substantially square form larger than the heat dissipation tab 10 in the above-mentioned leadframe 2. The first bumps 18 are arranged along the peripheral area of the principal surface of the pellet 25. Each of the first bumps 18 is arranged to be in contact with the inner portion 9a of each lead 9 in the above-mentioned leadframe 2. The second bumps 19 are arranged in the center of the principal surface of the pellet 25 so as to be in contact with the heat dissipation tab 10 in the above-mentioned leadframe 2. The third bumps 20 and/or some of the second bumps 19 are arranged at the four corners of the principal surface of the pellet 25 so as to be in contact with the four heat dissipation (fin) leads 7 in the above-mentioned leadframe 2. However, those bumps 20 and/or some of the bumps 19 need not be at the four corners of the principal surface of the pellet 25, but may be provided at other positions of the principal surface where the other bumps 20 do not exist. And, the bumps 20 and the electrode pads 24' may be omitted. The thus produced pellets 25 are mechanically connected to the leadframes 2 of the leadframe chain 1 according to the structure described above in the pellet bonding step as shown in FIGS. 7 and 8 (step 139). In the pellet bonding step, the leadframe chain 1 is fed in pitches to move the leadframes 2 one after another.

When a pellet 25 is connected to the leadframe 2, the first bumps 18 of the pellet 25 are bonded to the inner portions 9a of the leads 9 of the leadframe 2, the second bumps 19 to the heat dissipation tab 10, and the third bumps 20 at or near the corners to the heat dissipation (fin) leads 7. This bonding operation is performed by applying some pressure and heat at a specified temperature (about 500° C., for example) with the pellet 25 matched with the leadframe 2 as described above. In this bonding operation, for example, a gold-tin eutectic alloy is formed between the tin film deposited on the surface of the leadframe 2 and the gold of the main bodies of the bumps 18, 19 and 20, so that inner portions 9a of the leads 9, the heat dissipation tab 10, and the heat dissipation (fin) leads 7 are bonded integrally to the bumps 18, 19 and 20.

Figure 7:
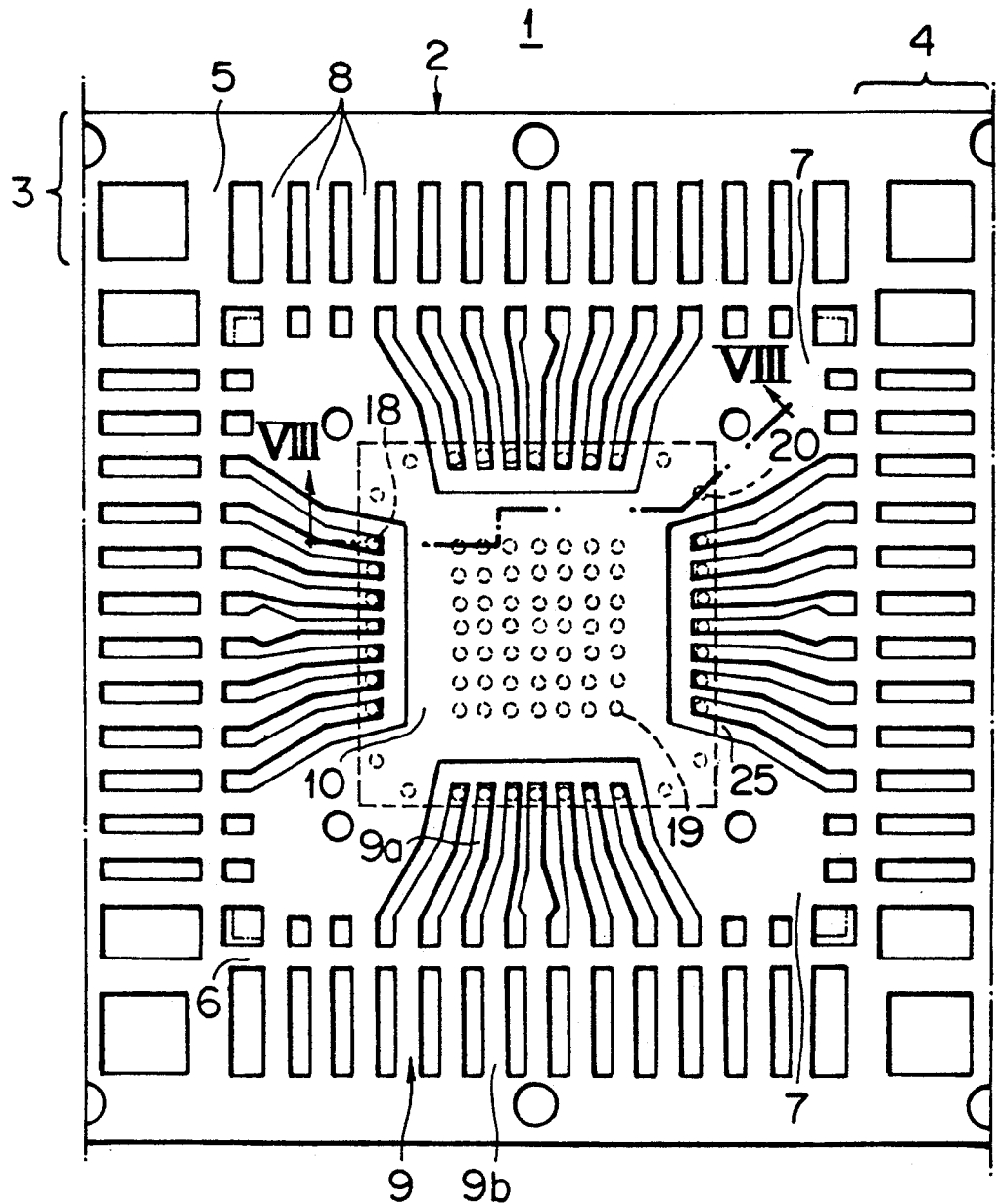
FIG. 7 is a plan view showing a manner in which a pellet is bonded to a single leadframe according to an embodiment of the present invention.
Figure 8:
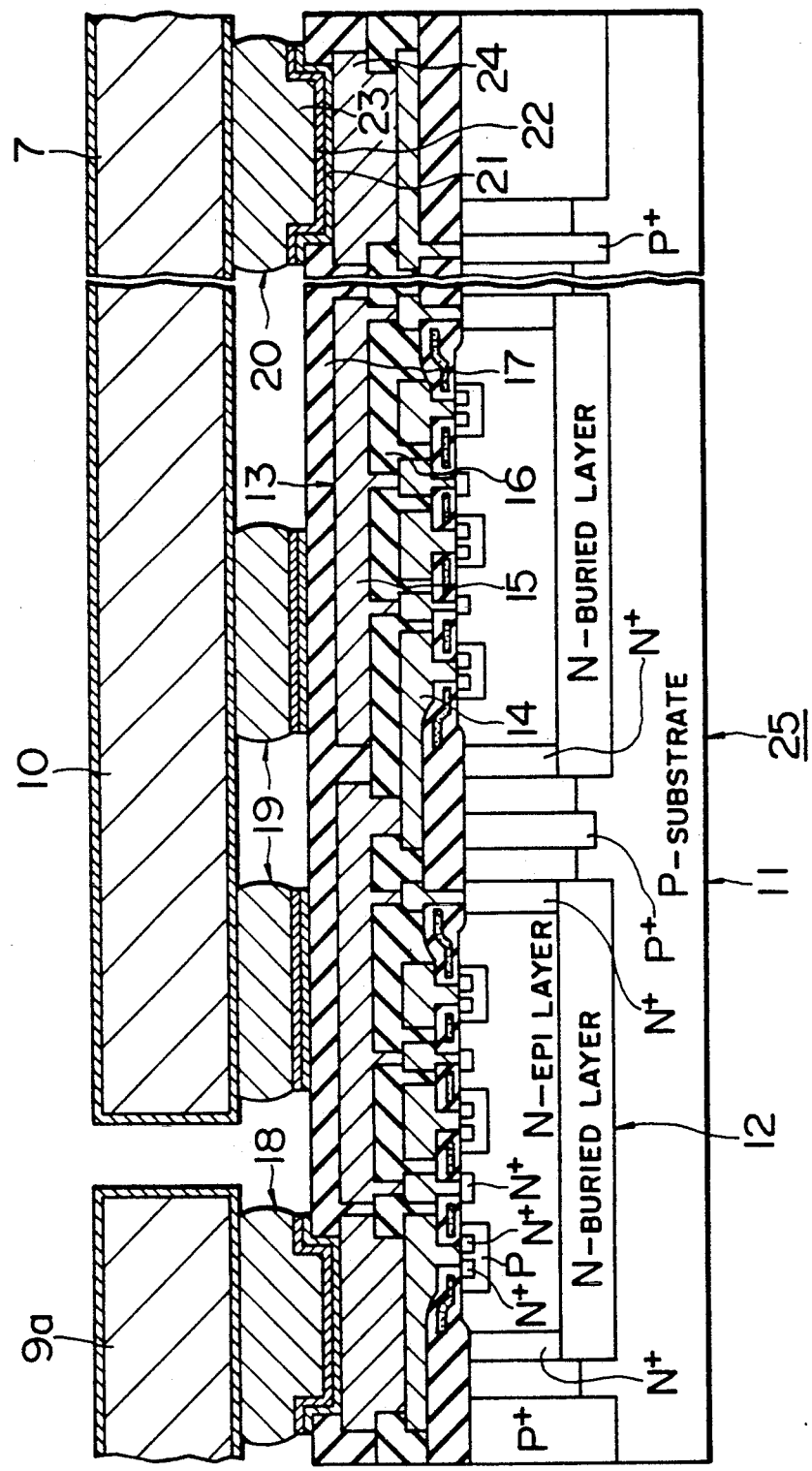
FIG. 8 is a sectional view taken along line VIII—VIII in FIG. 7.

As shown in FIGS. 7 and 8, the first bumps 18 have been bonded integrally to the inner portions 9a of the leads 9, respectively with the pellet 25 mechanically connected to the leadframe 2 as shown in FIGS. 7 and 8, so that the leads 9 are electrically connected through the first bumps 18 to the integrated circuit 12 of the pellet 25. On the other hand, the second bumps 19 have been bonded integrally to the heat dissipation tab 10. By this bonding, the heat dissipation tab 10 is thermally (mechanically) connected through the second bumps 19 to the heat dissipation tab 10. In addition, the third bumps 20 have been bonded integrally to the heat dissipation (fin) leads 7, and by this bonding, the heat dissipation (fin) leads 7 are electrically and thermally connected through the third bumps 20 to the pellet 25.

Figure 9:
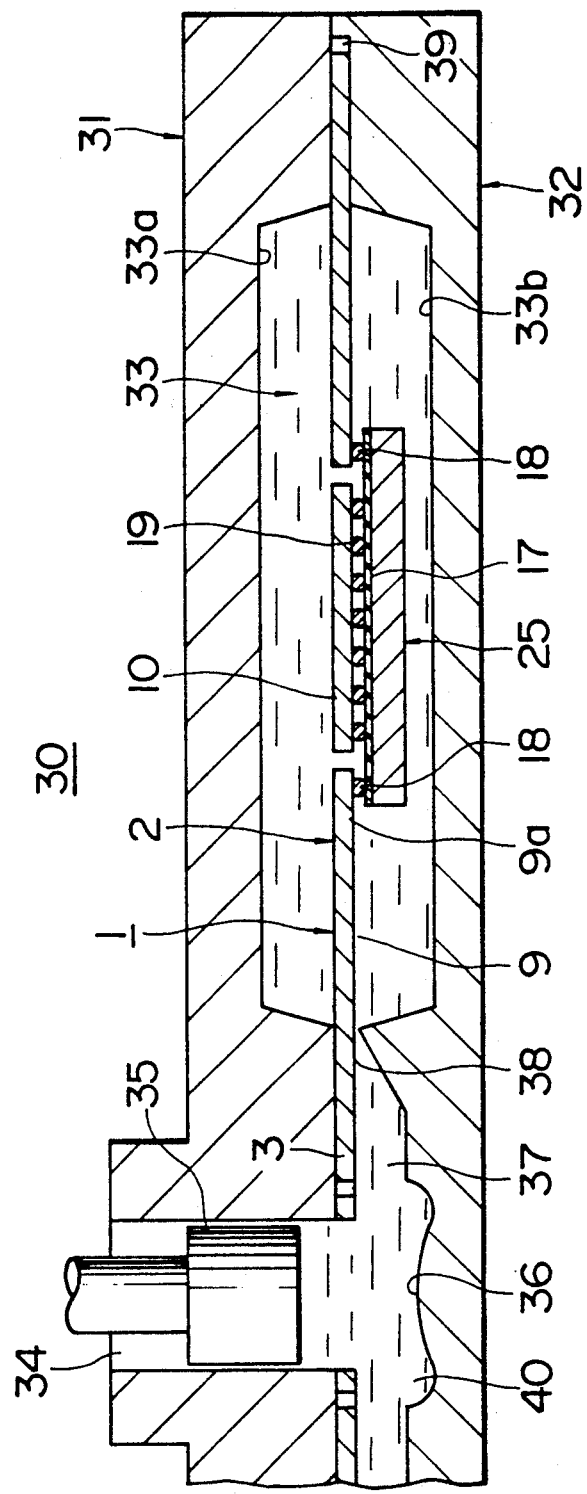
FIG. 9 is a diagram for explaining molding of a resin package.
Figure 10:
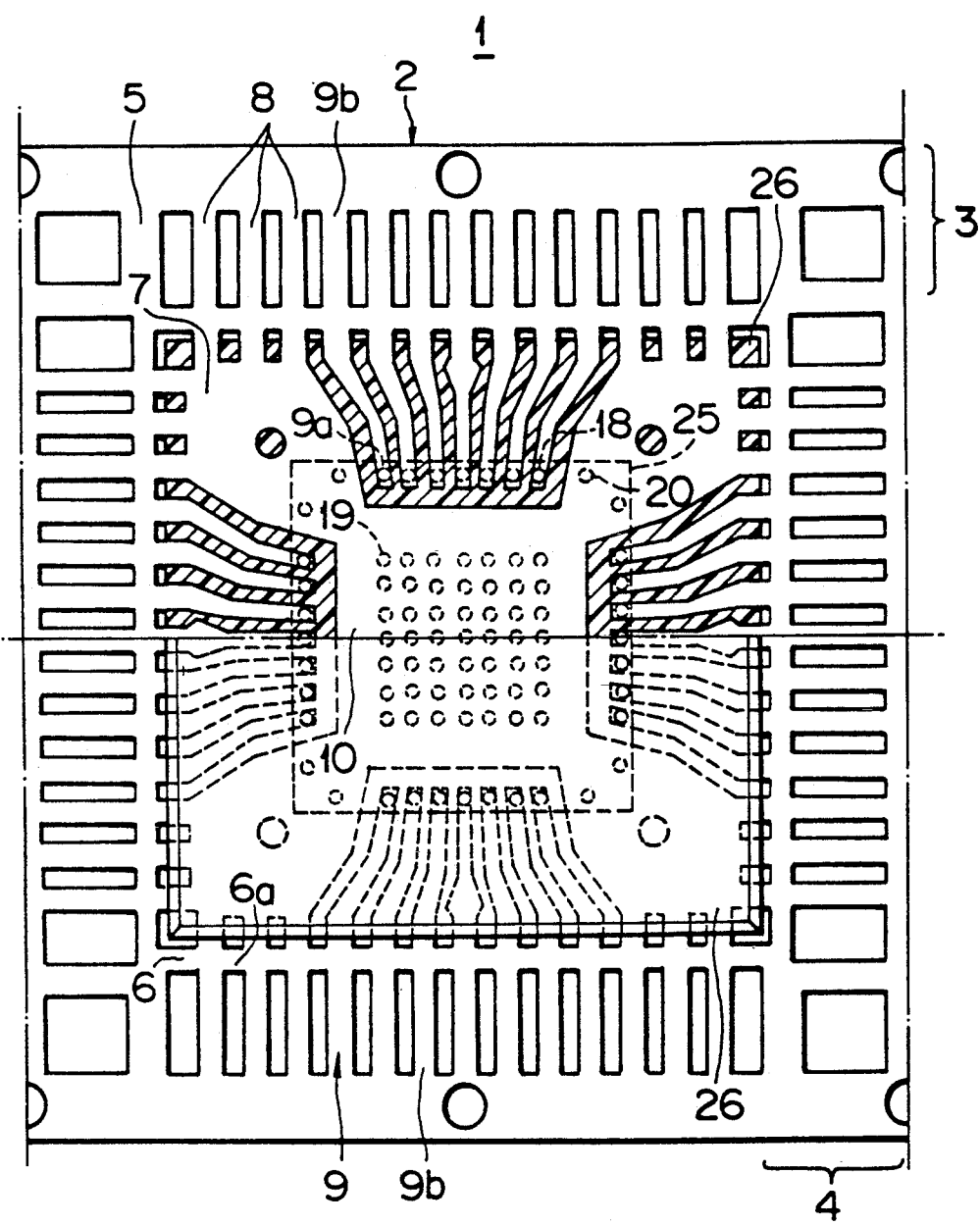
FIG. 10 is a plan (sectional) view, partially cut away, of the pellet bonded to a single leadframe after resin molding.

In the leadframe chain 1 on which the pellets 25 have been bonded to the leadframes 2, resin-molded packages 26 are made for the leadframes 2 simultaneously as shown in FIG. 10 by using a transfer molding apparatus 30 indicated in FIG. 9 (step 140).

The transfer molding apparatus 30 in FIG. 9 comprises a couple of dies, an upper die 31 and a lower die 32, which are closed by a cylinder unit or the like (not shown). In the mating faces of the upper die 31 and the lower die 32, there are formed faces of the upper die 31 and the lower die 32, there are formed a plurality of upper die cavities 33a and lower die cavities 33b, which form cavities 33 in cooperation with each other. In the mating face of the upper die 31, there is formed a pot 34 in which a plunger 35 for feeding a molding resin is inserted, the plunger 35 being moved up and down by a cylinder unit (not shown). In the mating face of the lower die 32, there are formed a cull 36 at a position facing the pot 34 and a plurality of runners 37 extending radially so as to communicate with the pot 34. The other ends of the runners 37 communicate with the lower die cavities, and gates 38 are formed at the connection parts between the runners 37 and the lower die cavities 33b in such a manner as to be able to feed the resin into the cavities 33. In the mating face of the lower die 32, there are provided relief recesses 39 in a rectangular form a little larger than the outer form of the leadframe chain and having a depth substantially the same in dimension as the thickness of the leadframe chain 1 to permit each leadframe chain 1 to slide inside the recess.

In transfer molding of resin packages using a leadframe chain 1 structured as mentioned above, the cavities 33 formed by the upper and lower dies 31 and 32 correspond to the spaces defined by the four tie bars 6 (FIG. 10) of each leadframe 2.

In transfer molding, the leadframe chain 1 structured as described is set such that the leadframe chain 1 is accommodated in the relief recesses 39 provided in the lower die 32 and that the pellets 25 to be placed against the corresponding leadframes 2 are accommodated in the cavities 33.

Subsequently, the upper die 31 and the lower die 32 are closed, a molding resin 40 is pressure-fed from the pot 34 by the plunger 35 through the runners 37 and the gates 38 into the cavities 33. When a resin 40 has been fed and resin packages 26 have been molded by thermosetting, the upper die 31 and the lower die 32 are parted, and resin-molded packages 26 are released from the dies by ejector pins (not shown). A leadframe chain 1 having packages 19 formed as shown in FIG. 10 are taken out of the transfer molding apparatus 30.

An IC package resin-molded as described contains a pellet 25, inner portions 9a of the leads 9, and a heat dissipation tab 10 and heat dissipation (fin) leads 7 sealed therein. The heat dissipation fins 8 provided at distal ends of the heat dissipation (fin) leads 7 extend in a direction substantially at right angles with the side faces of the corners of the resin-molded package 26.

Then, in a lead cutting and shaping step (step 141), the leadframe chain 1 has the outer frame members 3, the section frame members 4 and the dams 6a cut off from the leads 9 and the heat dissipation fins 8 of each leadframe 2 by a lead cutting unit (not shown), and subsequently, the outer portions 9b of the leads 9 and the heat dissipation fins B are bent in the form of a gull wing by a lead shaping apparatus (not shown). In this manner, a low thermal resistance QFP•IC device 27 structured as described is produced.

Figure 11:
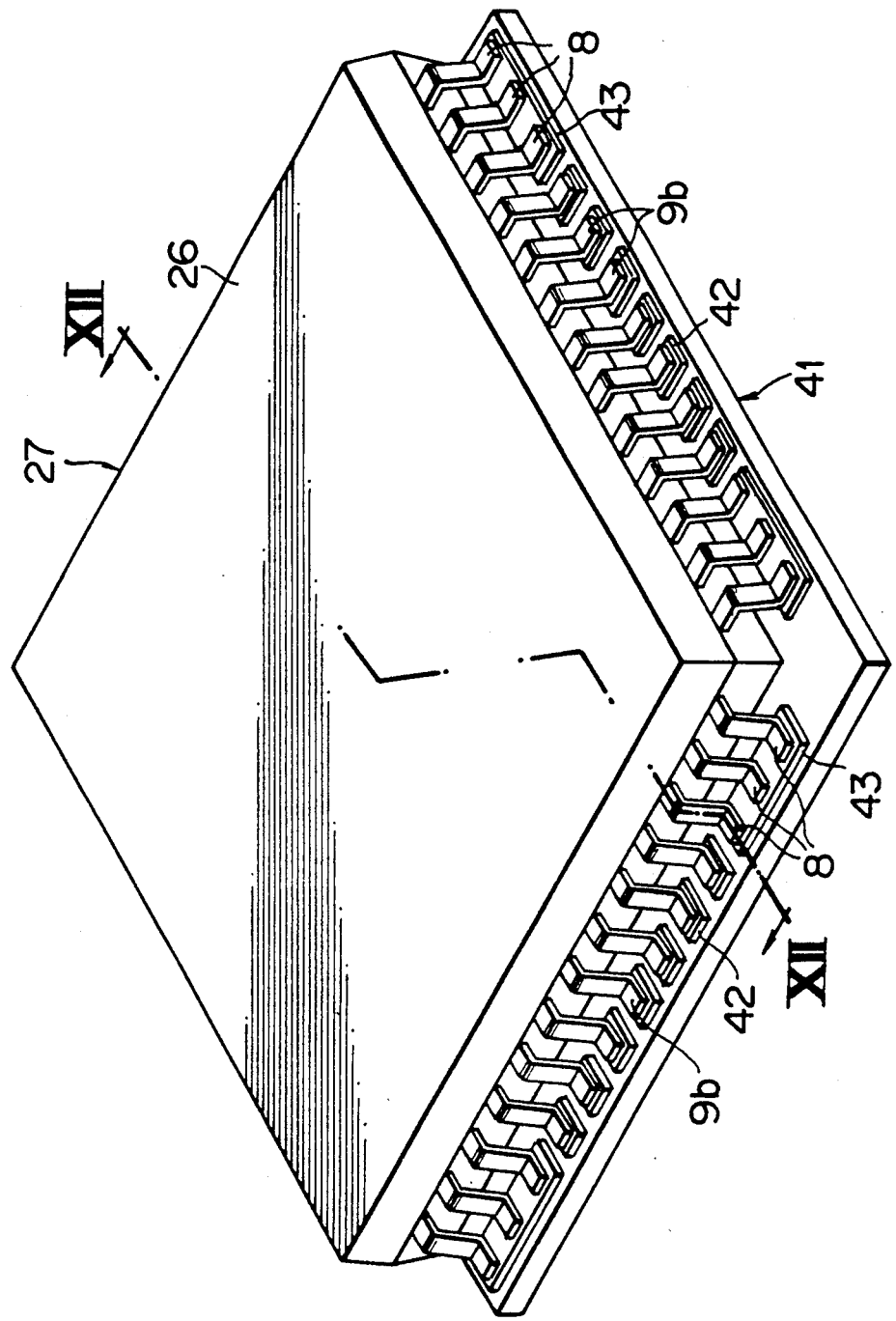
FIG. 11 is a perspective view of a packaged semiconductor device according to an embodiment of the present invention.
Figure 12:
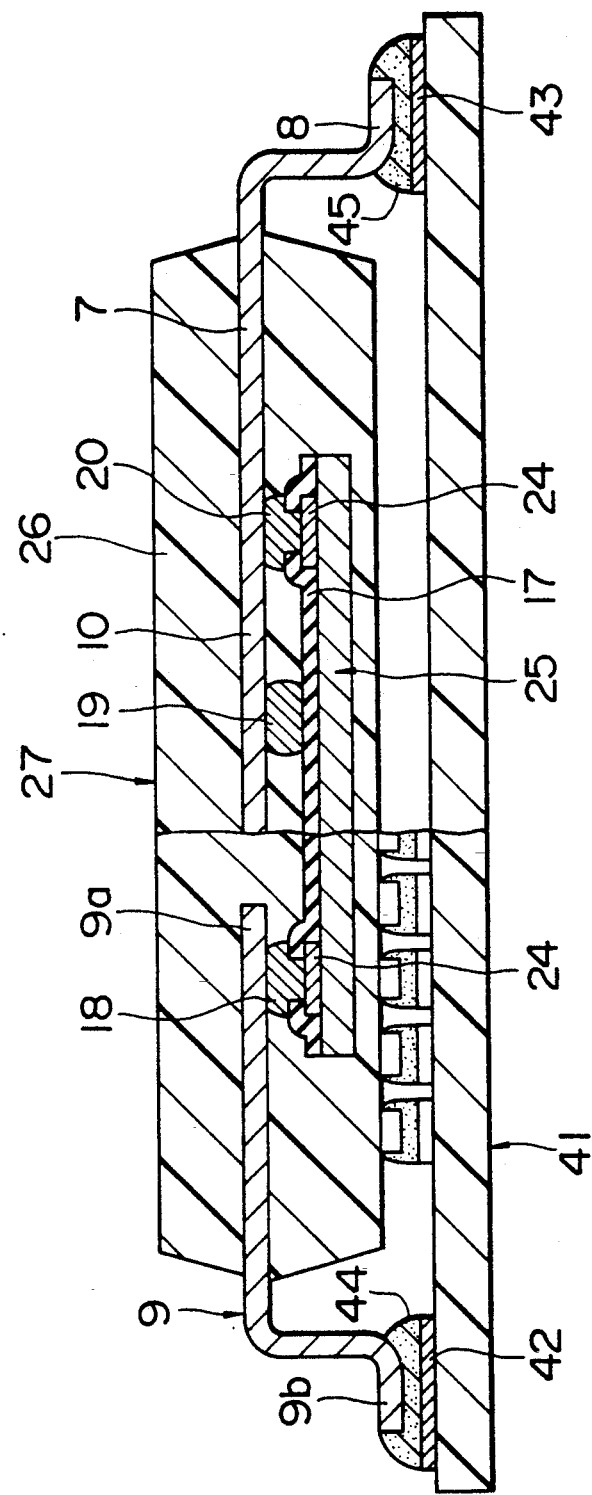
FIG. 12 is a sectional view taken along line XII—XII in FIG. 11.

The thus fabricated low thermal resistance QFP•IC device 27 is mounted on a printed wiring board 41 as shown in FIGS. 11 and 12.

In FIGS. 11 and 12 (a sectional view taken along the line XII—XII of FIG. 11), on the printed wiring board 41, a plurality of electrical conduction lands 42 are arranged like a substantially square frame, for example, so as to correspond to the outer portions 9b of the leads 9 of the low thermal resistance QFP•IC device 27 as a mounted device. Those conduction lands 42 made of a conductive material such as copper are shaped in the form of a small flat plate substantially rectangular, for example. On the printed wiring board 41, heat dissipation lands 43 are arranged beyond both ends of each row of the lands 42 so as to correspond to the heat dissipation fins 8 of this QFP•IC device 27. The heat dissipation lands 43 are shaped in the form of, for example, substantially a rectangular flat plate which corresponds to a row of the heat dissipation fins 8. A cream solder (not shown) is spread on the individual lands 42 and 43 by a suitable thick film forming means such as screen printing or the like.

When the low thermal resistance QFP•IC device 27 structured as described is mounted on the surface of the printed wiring board 41, the outer portions 9b of the leads 9 and the heat dissipation fins 8 of the GFP•IC device 27 are matched with the lands 42 and 43 on the printed wiring board 41, and with the cream solder spread on the lands, the QFP•IC device 27 is set on the printed wiring board 41. Subsequently, the cream solder is heated and melted by suitable means such as reflow soldering, and hardens, so that solder joints 44 and 45 are formed between the outer portions 9b of the leads 9 and the heat dissipation fins 8, and the lands 42 and 43. Under this condition, the low thermal resistance QFP•IC device 27 is connected electrically and mechanically to, and surface-mounted on the printed wiring board 41.

The pellet 25 is bonded directly by the second bumps 19 to the heat dissipation tab 10 which is formed integrally with the heat dissipation (fin) leads 7. Therefore, when the pellet 25 generates heat while the wiring board having the QFP•IC device 27 mounted thereon is in operation, the heat of the pellet 25 is conducted directly to the heat dissipation (fin) leads 7 through the heat dissipation bumps 19 and the heat dissipation tab 10, and the heat is dissipated effectively from the whole of the heat dissipation fins 8 connected with the heat dissipation (fin) leads 7 an additionally, through the printed wiring board 41. To be more specific, the heat which has traveled from the pellet 25 through the second bumps 19 and the heat dissipation tab 10 to the heat dissipation (fin) leads 7, is conveyed from the heat dissipation fins 8, which is in an integral construction with the heat dissipation (fin) leads 7, via the leads 43 to the printed wiring board 41.

In this heat dissipation process, the second bumps, arranged in the active region (center of the principal surface, for example) of the pellet 25, take up the heat from the pellet 25 effectively, and conduct the heat to the heat dissipation tab 10 as a heat sink. Thus, the heat dissipation effect is further enhanced, thereby quickly and sufficiently cooling the pellet 25.

The heat dissipation (fin) leads 7 are electrically connected through the third bumps 20 and the first level conductor pattern to the p-type substrate, and therefore, the heat dissipation (fin) leads 7 are at the potential of the p-type substrate 11. Accordingly, the heat dissipation fins 8 may be used as the reference voltage line at a portion of the path between the p-substrate 11 and the lands 43 through the heat dissipation (fin) leads 7 and the third bumps 20. Since the heat is conducted to the third bumps 20, the heat can be dissipated effectively through the above-mentioned path.

Incidentally, the integrated circuit, i.e., electronic circuit 12 is electrically connected through the first bumps 18, the inner portions 9a of the leads 9, and the lands 43, and therefore driven electrically.

According to the above embodiment, one or more effects can be obtained, which will be described below.

a) The heat dissipation tab 10 is connected mechanically through the heat dissipation bumps 19 to the principal surface of the pellet 25 in which the integrated circuit 12 has been formed. Therefore, the generated heat of the integrated circuit 12 of the pellet 25 is taken up by the heat dissipation tab 10 by heat conduction through the heat dissipation bumps 19. By this arrangement, the heat of the pellet 5 can be dissipated fairly effectively.

b) The heat dissipation bumps are arranged at the position corresponding to the active region of the principal surface of the pellet 25 where heat is most likely to be generated. By this arrangement, the heat can be taken effectively. This contributes to a further improvement of the heat dissipation effects.

c) The heat dissipation tab 10, connected through the bumps 19 to the pellet 25, has the heat dissipation fins 8 formed integrally therewith through the heat dissipation (fin) leads 7. And, the heat dissipation fins 8 are soldered to the printed wiring board 41. Therefore, the heat generated at the pellet 25 can be conducted directly to the board 41. This brings about a step further promotion of the heat dissipation effects.

d) The heat dissipation bumps 20, connected electrically to the p-substrate 11, etc. of the pellet 25, also serve for electrical connection. The heat dissipators such as the heat dissipation tab, connected mechanically to the heat dissipation bumps 19, can also be utilized to do double duty as an external terminal for receiving a reference voltage. By this arrangement, the wiring can be simplified accordingly.

e) The heat dissipation tab 10 is formed integrally with the leadframe chain 1. Therefore, when the pellet 25 is bonded through the electrical connection bumps 18 to the inner portions 9a of the leads 9 of the leadframe chain 1, the heat dissipation tab 10 can be coupled mechanically to the pellet 25. As a result, the number of parts, and processing and assembling man-hours can be reduced, so that productivity can be prevented from lowering.

f) The pellet bonding and wire bonding operations can be done away with, with the result that productivity can be improved.

g) The integrated circuit 12 of the pellet 2 can be connected electrically to the leads 9 and the heat dissipation tab 10 (heat dissipation leads 7) through the intermediary of the electrical connection bumps 18 and the electrical connection and heat dissipation bumps 20. Therefore, heat can be dissipated and the wiring resistance can be decreased at the same time. Therefore, the performance of the semiconductor device can be improved.

h) The semiconductor pellet, leads and heat dissipators are molded in resin packages. Therefore, when the semiconductor device is mounted on a printed wiring board or when an external force attributable to vibration in transit is applied to the semiconductor device after the semiconductor device was mounted, accidents such as bending of a lead can be prevented from occurring, so that defects such as short-circuit or discontinuity can be avoided.

i) Leads of packaged semiconductor devices according to the above-described embodiments are made from leadframes having a thickness (usually 0.1 mm–0.25 mm) larger than that (usually 0.035 mm–0.07 mm) of the leadframes used for semiconductor devices manufactured by the TAB. Therefore, the completed packaged semiconductor devices have their leads already formed to a final size and shape by cutting, bending and other necessary treatments, unlike the "TAB devices" kept carried on a tape with their leads not shaped until immediately before mounting onto a circuit board or the like because of the low mechanical strength (small thickness).

j) Since the transfer molding can be employed in the described embodiments, the completed semiconductor devices have a predetermined uniform size and shape, contrary to the "TAB devices" which are usually packaged by the use of potting and therefore have ununiform sizes and shapes for individual devices.

Figure 13:
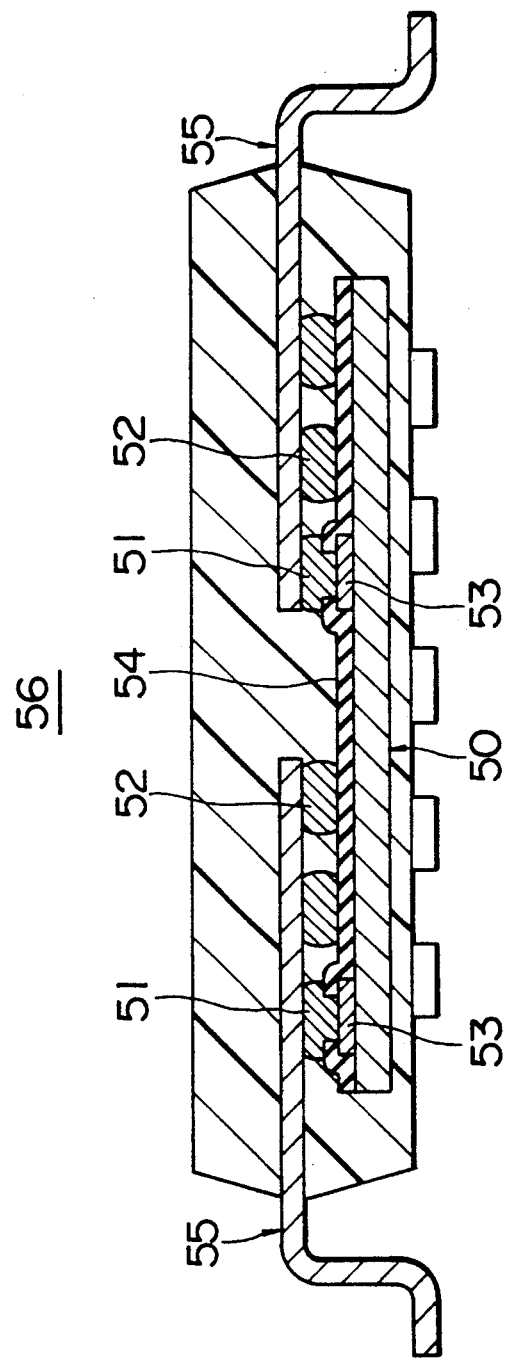
FIG. 13 is a sectional view of the packaged semiconductor device according to an embodiment of the present invention.
Figure 14:
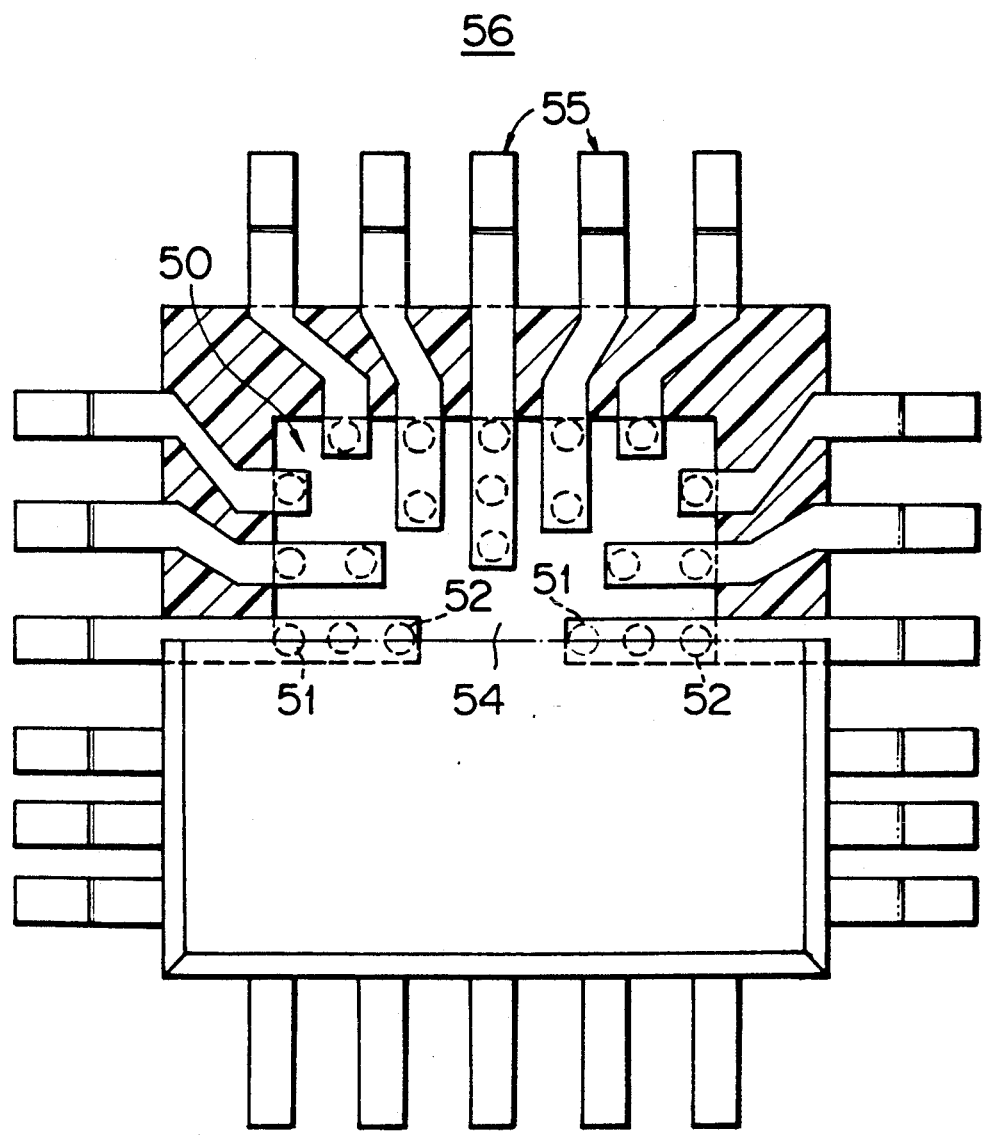
FIG. 14 is a plan (sectional) view, partially cut away, of the device in FIG. 13.

FIG. 13 is a front view in cross section of the QFP•IC device as a second embodiment of the present invention. FIG. 4 is a plan view, partly in cross section, of this QFP•IC device.

The differences of the second embodiment from the first embodiment are that the heat dissipation tab 10 is omitted, that instead, leads for electrode connection serve also as heat dissipators, and that the electrical connection bumps and heat dissipation bumps are in contact with the above-mentioned double-function leads.

To be more specific, in the second embodiment, a pellet in which an integrated circuit (not shown) is provided with a plurality of electrical connection bumps (hereafter sometimes referred to as first bumps) 51 and a plurality of heat dissipation bumps (hereafter sometimes referred to as second bumps) 52. The first bumps are provided on electrode pads 53 electrically connected to the electronic circuit, while the second bumps 52 are provided on the pellet surface insulated from the integrated circuit and the electrode pads, for example, on a passivation film 54. The first bumps 51 are arranged along a peripheral area of the pellet 50, but some of the first bumps 51 may be arranged at a suitable place in the center of the pellet 50. The second bumps 52 are arranged at positions corresponding to an active region of the pellet 50, thereby extensively covering the active region. Double function leads 55 for heat dissipation and electrical connection (hereafter referred to as double function leads) 55 are arranged radially on the principal surface of the pellet with an insulation space provided between the leads 55. Proximal ends of the double duty leads 55, arranged at the centers of the four sides extend to the center area of the pellet 50. The extreme ends of some of the double function leads 55 extend upwards with respect to the center area of the pellet 50. At least one of the double function leads 55 of the pellet, extending to the center area of the pellet 50, has one bump 51 and one or more second bumps 52 simultaneously bonded thereto. Therefore, the double function leads 55 having the first bumps 51 and the second bump 52 simultaneously bonded thereto are electrically connected to the integrated circuit of the pellet 50 through the intermediary of the first bump 51 and also thermally coupled to the pellet 50 through the intermediary of the second bump 52. Needless to say, at least one of the leads 55 not located at the centers of the four sides may have one first bump and one or more second bumps simultaneously bonded thereto.

When a QFP•IC device 56 structured as described is mounted on the surface of a board (not shown) and put into operation, current is conducted through the double function leads 55, and the heat of the pellet 50 is also conducted through the double function leads directly to the board. More specifically, the heat of the pellet 50 is taken up by the second bumps 52, conducted to the double function leads 55, and then conveyed from the double function leads 55 to the board. Therefore, the heat dissipation performance of the QFP•IC device 56 is extremely good.

According to the second embodiment, the following effects can be obtained in addition to those of the first embodiment.

a) Wires need not be stretched around on the principal surface of the pellet, so that a parasitic resistance of the leads can be reduced.

b) The electrical connection bumps 51 are arranged in the center of the pellet 50, and therefore, the number of degrees of freedom in the layout of external terminals in the pellet 50 can be increased, so that the rigidity of layout of an integrated circuit of the pellet 50 can be relaxed.

Figure 16A:
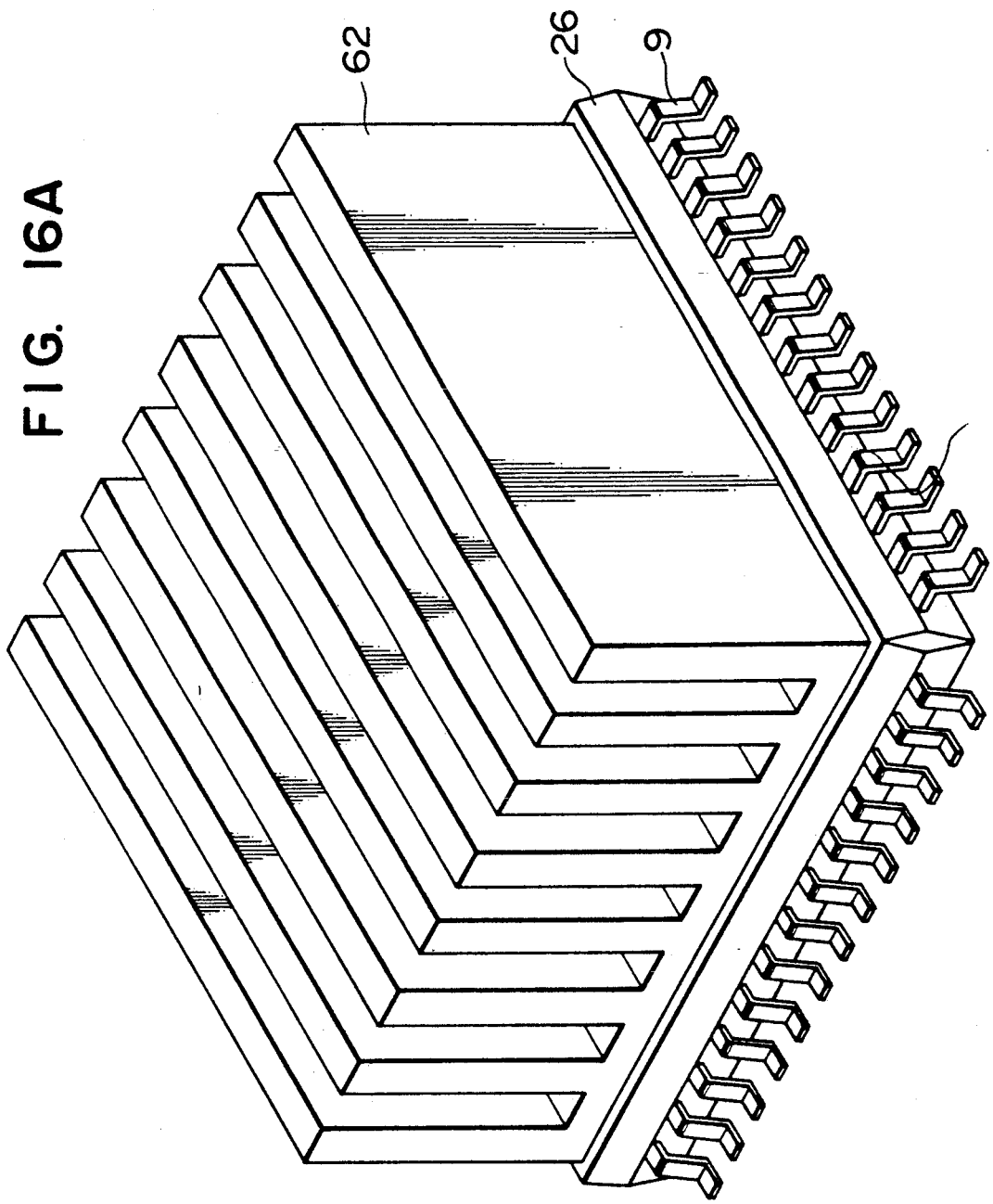
FIG. 16A is a perspective view of the device in FIG. 15.
Figure 16B:
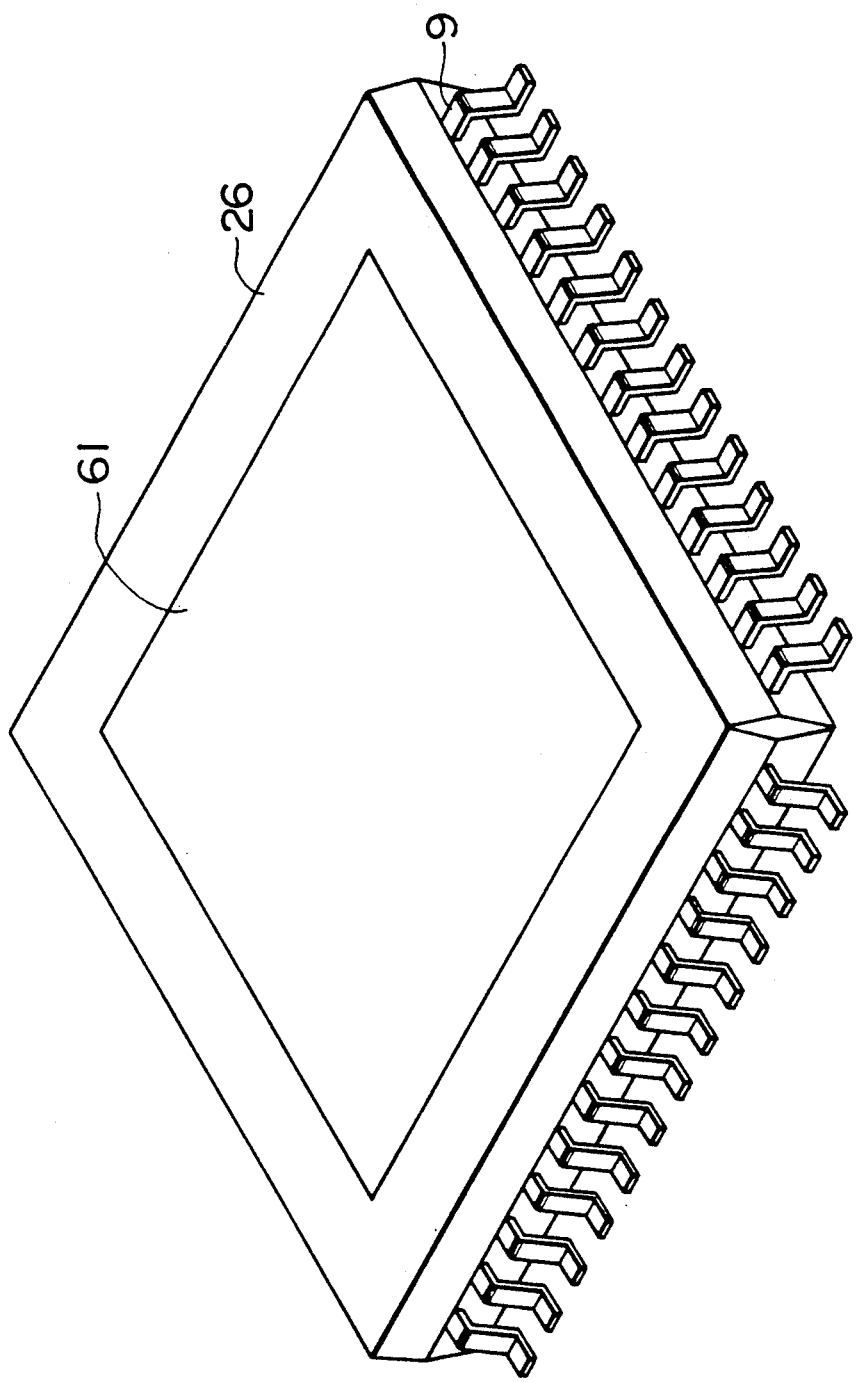
FIG. 16B is a perspective view of the structure of the device of FIG. 16A, with the heat sink removed.

FIGS. 15, 16A and 16B are an elevation in cross section and perspective views of a QFP•IC device according to a third embodiment of this invention, which includes a combination of a heat sink and a heat dissipation fins on the principal surface of a pellet in which an electronic circuit has been formed.

The differences of the third embodiment from the first embodiment are that in place of the heat dissipation tab 10, a heat sink 61 as a heat dissipator, which is a separate body from the leadframe chain 1, is connected mechanically through the heat dissipation bumps 19 to the pellet 25 in such a manner as to be thermally coupled to the pellet 25, while heat dissipation fins 62 are connected mechanically to the heat sink 61 in such a manner as to be thermally coupled to the heat sink 61.

According to the third embodiment, the following effects can be obtained in addition to those of the first embodiment.

a) Before combined, the heat sink is a discrete body separate from the leadframe. Therefore, it is easy to increase the thickness of the heat sink only and thereby improve the heat dissipation performance of the semiconductor device.

b) By forming a heat sink of a material with good heat conductivity separately from the leads for electrical connection, the heat dissipation performance can be further improved.

c) By forming the electrical connection lead and the heat dissipation fins of a material high in mechanical strength separately from the heat sink, the leads and then heat dissipation fins can be prevented from being bent or damaged. By the heat dissipation effect mentioned above, a high heat dissipation performance can be secured.

The present invention has bee described with reference to the preferred embodiments. The present invention is not limited to the embodiments described, but obviously, widely different embodiments of the present invention may be constructed without departing from the spirit and the scope of the present invention.

When making heat sinks by punching or etching, for example, if heat sinks are arranged in the form of a multiple-connected heat sink frame, this will improve handleability.

The shape, size, and construction of the heat dissipation tab, double duty leads and heat sink should preferably be selected to suit various conditions such as the required heat dissipation performance, component mounting form (use or no use of retainers or clamp bolts, for example), and the performance, size, shape and construction of the pellet. External heat dissipation fins, bolt holes, internal threads or the like may be provided as occasion demands.

The material for heat dissipation components is not limited to copper alloy, but other metallic materials with better heat conductivity such as aluminum may be used. Above all, it is desirable to use a material superior in heat conductivity such as silicon carbide (SiC) and equivalent in thermal expansion coefficient to silicon used for the pellet.

With regard to the above-mentioned embodiments, description has been made of cases in which the bumps are provided on the pellet side. However, the bumps may be provided on the leadframe side. Or, the electrical connection bumps may be provided on the pellet side and the heat dissipation bumps may be provided on the heat dissipation component side.

The foregoing description has been made mainly of the cases where the invention is applied to the QFP•IC device, which is a specific area of industry in which this invention was made. However, this invention is not limited to this application, but can be applied to IC devices in surface mounted type resin-molded QFJ (Quad Flat J-leaded package) IC devices or PLCC IC devices, SOJ (Small Outline J-leaded package) IC devices, QFI (Quad Flat I-leaded package) IC devices, and SOI (Small Outline I-leaded package) IC devices. In addition, this invention can be applied to resin-molded power transistors and other electronic devices in general. This invention provides excellent effects when it is applied to a semiconductor device which handles high voltages and large currents and which is required to have a high heat dissipation performance.

We claim:

1. A packaged semiconductor device comprising:
   a semiconductor pellet having an electronic circuit therein and electrode pads on a peripheral portion of a principal surface of said pellet, said electronic circuit having a tendency to generate heat in operation;
   a plurality of first bumps provided on said electrode pads and electrically connected thereto;
   a plurality of second bumps provided over a central portion of said principal surface of said pellet and means for electrically insulating said second bumps from said electronic circuit and said electrode pads, said second bumps being arranged relatively nearer to said electronic circuit than said first bumps for thermal coupling to said electronic circuit;
   a plurality of first electrical connection leads connected to said first bumps;
   second lead means connected to at least one of said second bumps for thermal coupling to said electronic circuit to conduct heat generated by said electronic circuit externally for heat dissipation, said second lead means including a tab portion connected to said at least one second bump and heat dissipation leads integral with and extending from said tabl portion; and
   a packaging material sealing said pellet, said first bump and said second bumps and parts of said first electrical connection leads and second lead means.

2. A device according to cliam 1, further comprising at least one third bump provided on at least one of said electrode pads which is not provided with said first bump, which serves as a common potential pad.

3. A device according to claim 2, wherein said tab portion covers and is connected to said second bumps and said at least one third bump, whereby said 4. A device according to claim 1, wherein said electrical insulating means is a passivation film covering said principal surface, and said second bumps are secured to said passivation film.

5. A device according to claim 1, wherein said first electrical connection leads include a plurality of first strip-like leads in electrical connection to associated first bumps;
   said second lead means includes a plurality of second strip-like leads in thermal coupling to said second bumps; and
   at least one of said first leads is further engaged with at elast one of said second bumps for thermal coupling to said electronic circuit while at least one of said second leads being further engaged with one of said first bumps for electrical connection thereto.

6. A package semiconductor device comprising:
   a semiconductor pellet having an electronic circuit therein and electrode pads on a principal surface of said pellet, said electronic circuit having a tendency to generate heat in operation;
   a first bump provided on at least one of said electrode pads and electrically connected thereto;
   a plurality of second bumps provided over said principal surface of said pellet and means for electrically insulating said second bumps from said electronic circuit and said electrode pads;
   at least one first lead engaged with said first bump to connect to an associated electrode pad and further engaged with at least one of said second bumps for thermal coupling to said electronic circuit;
   at least one second lead engaged with at least another one of said second bumps for thermal coupling to said electronic circuit, said at least one first lead and said at least one second lead serving to conduct heat generated by said electronic circuit externally for heat dissipation; and
   a packaging material sealing said pellet, said first bump and said second bumps and parts of said at least one first lead and said at least one second lead.

7. A device according to claim 7, wherein said electrical insulating means is a passivation film covering said principal surface, and said second bumps are secured to said passivation film.

8. A packaged semiconductor device comprising:
   a semiconductor pellet having an electronic circuit therein and electrode pads on a principal surface of said pellet, said electronic circuit having a tendency to generate heat in operation;
   a plurality of first bumps provided on said electrode pads;
   at least one second bump provided over said principal surface of said pellet and means for electrically insulating said at least one second bump from said electronic circuit and said electrode pads;
   at least one first lead engaged with one of said first bumps to connect to an associated electrode pad and further engaged with said at least one second bump for thermal coupling to said electronic circuit, said at least one first lead serving to conduct heat generated by said electronic circuit externally for heat dissipation;
   at least one second lead engaged with at least another one of said first bumps for electrical connection to an associated electrode pad; and
   a packaging material sealing said pellet, said first bumps and said at least one second bump and parts of said at least one first lead and said at least one second lead.

9. A device according to claim 8, wherein said electrical insulating means is a passivation film covering said principal surface, and said at least one second bump is secured to said passivation film.

10. A method of manufacturing a semiconductor device comprising the steps of:
    forming an electronic circuit in one principal surface of a semiconductor wafer and forming a plurality of electrode pads on the principal surface of said wafer;
    forming electrical connection bumps for electrical connection to said electronic circuit on said principal surface of said wafer and forming heat dissipation bumps for said electronic circuit over said principal surface of said wafer with an insulating layer interposed therebetween;

connecting a plurality of leads and a heat dissipator to said principal surface of said wafer through said electrical connection bumps and said heat dissipation bumps, respectively;

securing a heat dissipation fin unit to said heat dissipator; and sealing said wafer, parts of said leads and part of said heat dissipator.

11. A method of manufacturing a semiconductor device comprising the steps of:

forming an electronic circuit in one principal surface of a semiconductor wafer and forming a pluraltiy of electrode pads on the principal surface of said wafer;

forming electrical connection bumps for electrical connection to said electronic circuit on said principal surface of said wafer and forming heat dissipation bumps for said electronic circuit over said principal surface of said wafer with an insulating layer interposed therebetween;

connecting a plurality of leads and a heat dissipator to said principal surface of said wafer through said electrical connection bumps and said heat dissipation bumps, respectively, wherein said leads and said heat dissipator are prepared in the form of a chain of lead frames integral with one another and said leads and said dissipator integral with each other are connected to said principal surface of said wafer; and sealing said wafer, parts of said leads and part of said heat dissipator.

* * * * *

UNITED STATES PATENT AND TRADEMARK OFFICE
CERTIFICATE OF CORRECTION

PATENT NO. : 5,299,091
DATED : March 29, 1994
INVENTOR(S) : Akio Hoshi, et. al.

It is certified that error appears in the above-indentified patent and that said Letters Patent is hereby corrected as shown below:

Col. 13, line 40, Claim 1, "tabl" should be --tab--;
Col. 13, line 50, Claim 3, after "said" insert --second lead means serves as both a heat conductor and an electrical conductor.--
Col. 15, line 12, Claim 11, "pluraltiy" should be --plurality--

Signed and Sealed this

Seventh Day of March, 1995

Attest:

BRUCE LEHMAN

Attesting Officer          Commissioner of Patents and Trademarks